United States Patent
Han et al.

(10) Patent No.: US 8,860,050 B2
(45) Date of Patent: Oct. 14, 2014

(54) HYBRID LIGHT EMITTING DEVICE HAVING A CAPPING LAYER

(71) Applicant: Electronics and Telecommunications Research Institute, Daejeon (KR)

(72) Inventors: Jun-Han Han, Daejeon (KR); Jeong Ik Lee, Gyeonggi-do (KR); Chul Woong Joo, Seoul (KR); Jin Woo Huh, Daejeon (KR); Jaehyun Moon, Daejeon (KR); Seung Koo Park, Daejeon (KR); Joon Tae Ahn, Daejeon (KR); Boong Joon Lee, Chungcheongbuk-do (KR); Nam Sung Cho, Daejeon (KR); Doo-Hee Cho, Daejeon (KR); Joo Hyun Hwang, Seoul (KR); Jin Wook Shin, Incheon (KR); Hye Yong Chu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/782,183

(22) Filed: Mar. 1, 2013

(65) Prior Publication Data

US 2014/0077170 A1    Mar. 20, 2014

(30) Foreign Application Priority Data

Sep. 19, 2012 (KR) .......................... 10-2012-0104044

(51) Int. Cl.
 *H01L 33/00* (2010.01)
 *H01L 51/52* (2006.01)
 *H01L 51/50* (2006.01)

(52) U.S. Cl.
 CPC ........ *H01L 51/5271* (2013.01); *H01L 51/5044* (2013.01); *H01L 51/5036* (2013.01)
 USPC .......... 257/89; 257/40; 257/103; 257/E51.022

(58) Field of Classification Search
 CPC . H01L 51/502; H01L 51/5036; H01L 51/504; H01L 51/5044; H01L 51/5203
 USPC ............................................................ 257/40
 See application file for complete search history.

(56) References Cited

U.S. PATENT DOCUMENTS

| 2006/0006792 A1* | 1/2006 | Strip | 313/500 |
| 2013/0181615 A1* | 7/2013 | Lee | 315/158 |

FOREIGN PATENT DOCUMENTS

| KR | 10-2007-0008071 A | 1/2007 |
| KR | 10-2010-0125135 A | 11/2010 |

* cited by examiner

*Primary Examiner* — Eva Y Montalvo
(74) *Attorney, Agent, or Firm* — Rabin & Berdo, P.C.

(57) ABSTRACT

Provided is a hybrid light emitting device. The hybrid light emitting device may include the first light emitting part on the substrate, the capping layer, and the second light emitting part. The first light emitting part may emit light having a first wavelength, and the first light emitting part may include a first electrode, an organic emitting layer, and a second electrode sequentially disposed. A second light emitting part may generate light having a second wavelength. A capping layer may be disposed between the organic emitting layer and the second light emitting part. The capping layer may reflect light having the first wavelength and transmit light having the second wavelength.

15 Claims, 3 Drawing Sheets

HYBRID LIGHT EMITTING DEVICE HAVING A CAPPING LAYER

CROSS-REFERENCE TO RELATED APPLICATIONS

This U.S. non-provisional patent application claims priority under 35 U.S.C. §119 of Korean Patent Application No. 10-2012-0104044, filed on Sep. 19, 2012, the entire contents of which are hereby incorporated by reference.

BACKGROUND OF THE INVENTION

The present invention relate to a hybrid light emitting device, and more particularly, to an organic and/or inorganic hybrid light emitting device.

Organic light emitting devices (OLEDs) are self-light emitting devices that electrically excite organic light emitting materials to emit light. OLEDs may emit light having various colors according to a kind of materials constituting an organic light emitting layer. OLEDs have superior display characteristics such as a wide viewing angle, a fast response time, a thin thickness, a low manufacturing cost, a high contrast, and the like. OLEDs are being in the spotlighted as next-generation flat panel display devices or the lighting apparatuses. Recently, the needs for OLEDs emitting light having various wavelengths are being increased.

SUMMARY OF THE INVENTION

The present invention provides an organic and/or inorganic light emitting device having improved luminance and emitting light which is easily variable in color.

Embodiments of the present invention provide hybrid light emitting devices including: a first light emitting part on a substrate; a second light emitting part spaced apart from the first light emitting part to face the first light emitting part; and a capping layer disposed between the first light emitting part and the second light emitting part, wherein the first light emitting part includes a first electrode, an organic light emitting layer, and a second electrode which are sequentially stacked on the substrate.

In some embodiments, the first light emitting part may emit light having a first wavelength, the second light emitting part may emit light having a second wavelength different from the first wavelength, and the capping layer may reflect the light having the first wavelength and allows the light having the second wavelength to pass therethrough.

In other embodiments, the light having the first wavelength and the light having the second wavelength may be mixed to realize a color.

In still other embodiments, the second light emitting part may include an optical layer and an inorganic light emitting device which are sequentially stacked on the capping layer.

In even other embodiments, the first electrode may have a refractive index different from that of the substrate, and the second electrode may have a refractive index different from that of the capping layer.

In yet other embodiments, the first electrode may have a thickness corresponding to about ¼ times or less of the first wavelength and about ¼ or less of the second wavelength.

In other embodiments of the present invention, hybrid light emitting devices may include: a first electrode on a substrate; an organic light emitting layer on the first electrode; a capping layer on the organic light emitting layer; a second electrode on the capping layer; and a light emitting part on the second electrode.

In some embodiments, light emitted from the organic light emitting layer may have a wavelength different from that of light emitted from the light emitting part.

In other embodiments, the capping layer may reflect light emitted from the organic light emitting layer and allow light emitted from the light emitting part to pass therethrough.

In still other embodiments, light emitted from the organic light emitting layer and light emitted from the light emitting part may be mixed to realize a color.

In even other embodiments, the light emitting part may include: an optical layer on the second electrode; and an inorganic light emitting device on the optical layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

For sufficient understanding of configurations and effects of the present invention, preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. It would be understood to a person skilled in the art that the concept of the present invention may be performed under any adequate environments.

In the following description, the technical terms are used only for explaining a specific exemplary embodiment while not limiting the present invention. The terms of a singular form may include plural forms unless specifically mentioned. The meaning of "include," "comprise," "including," or "comprising," specifies a property, a region, a fixed number, a step, a process, an element and/or a component but does not exclude other properties, regions, fixed numbers, steps, processes, elements and/or components.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. In the specification, 'and/or' means that it includes at least one of listed components.

Unless the terms used in the embodiments of the present invention are differently defined, the terms may be construed as commonly well-known meaning to a person skilled in the art.

Hereinafter, a hybrid light emitting device according to the present invention will be described with reference to the accompanying drawings.

Figure 1:
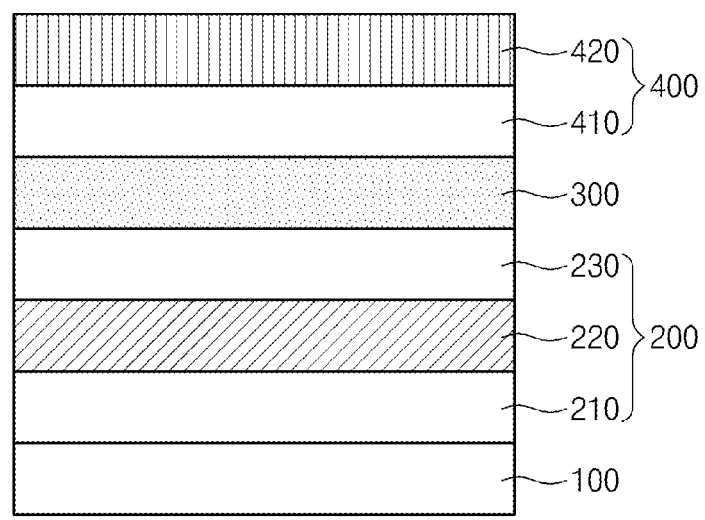
FIG. 1 is a cross-sectional view illustrating a hybrid light emitting device according to an embodiment of the present invention.

FIG. 1 is a cross-sectional view illustrating a hybrid light emitting device according to an embodiment of the present invention.

Referring to FIG. 1, a hybrid light emitting device 1 includes a first light emitting part 200, a capping layer 300, and a second light emitting part 400, which are sequentially stacked on a substrate 100. The first light emitting part 200 may generate light having a first wavelength $\lambda 1$. The second light emitting part 400 may generate light having a second wavelength $\lambda 2$. The second wavelength may be different from the first wavelength. Each of the first and second wavelengths may have a single or plurality of wavelengths.

The substrate 100 may transmit the light. The substrate 100 may include a glass and/or synthetic resin. For example, the substrate 100 may include at least one of polyimide (PI), polyethylene terephthalate (PET), polycarbonate (PC), and/or polyethersulfone (PES).

The first light emitting part 200 includes an organic light emitting device (OLED). For example, the first light emitting part 200 includes a first electrode 210, an organic light emitting layer 220, and a second electrode 230, which are sequentially stacked on the substrate 100.

The first electrode 210 may include a transparent conductive material. A metal electrode may be used as the first electrode 210. For example, the first electrode 210 may include at least one of aluminum (Al), silver (Ag), magnesium (Mg), molybdenum (Mo) and/or an alloy thereof. The first electrode 210 may have a refractive index different from that of the substrate 100. The substrate 100 and/or the first electrode 210 may be adjusted in refractive index so that light passing through the first electrode 210 is minimally reflected from a boundary between the substrate 100 and the first electrode 210. Here, the refractive index may be controlled by adjusting a thickness or material thereof. Light having a wavelength corresponding to about ¼ times or less of a thickness of the first electrode 210 may easily pass through the first electrode 210. The first electrode 210 may have a thickness corresponding to about ¼ times or less of the first wavelength $\lambda 1$ so that light emitted from the organic light emitting layer 220 passes through the first electrode 210. The first electrode 210 may have a thickness corresponding to about ¼ times or less of the second wavelength $\lambda 2$ so that light emitted from the organic light emitting layer 400 passes through the first electrode 210.

The organic light emitting layer 220 may generate light through recombination of electrons and holes which are supplied from the first electrode 210 and the second electrode 230. The organic light emitting layer 220 may be a multilayer structure. For example, the organic light emitting layer 220 may include at least one of a hole injecting layer, a hole transfer layer, an electron transfer layer, a light emitting layer, and/or an electron injecting layer.

The organic light emitting layer 220 may include at least one of organic light emitting materials. For example, the organic light emitting layer 220 may include at least one of polyfluorene derivatives, (poly)paraphenylenevinylene derivatives, polyphenylene derivatives, polyvinylcarbazole derivatives, polythiophene derivatives, anthracene derivatives, butadiene derivatives, tetracene derivatives, distyrylarylene derivatives, benzazole derivatives, and/or carbazole derivatives. According to the embodiments, the organic light emitting layer 220 may further include a dopant within the organic light emitting material. The dopant may include at least one of xanthene, perylene, cumarine, rhodamine, rubrene, dicyanomethylenepyran, thiopyran, (thia)pyrilium, periflanthene derivatives, indenoperylene derivatives, carbostyryl, nile red, and/or quinacridone.

The second electrode 230 may be a transparent electrode. The second electrode 230 may include a conductive material. For example, the second electrode 230 may include at least one of aluminum (Al), silver (Ag), magnesium (Mg), molybdenum (Mo) and/or an alloy thereof. One of the first electrode 210 and the second electrode 230 may be an anode, and the other one may be a cathode.

The capping layer 300 may include a single layer or multi layer structure. The capping layer 300 may have a structure in which dielectrics having different refractive indexes from each other are stacked. The capping layer 300 may have a refractive index different from that of the second electrode 230. The light having the first wavelength may be reflected by a boundary between the second electrode 230 and the capping layer 300 due to the refractive index difference therebetween. The light having the second wavelength passes through the boundary between the second electrode 230 and the capping layer 300. The second electrode 230 and/or the capping layer 300 may be adjusted in refractive index. The second electrode 230 may have a thickness corresponding to about ¼ times or less of the second wavelength $\lambda 2$ so that the light emitted from the organic light emitting layer 400 passes through the second electrode 230.

Figure 2:
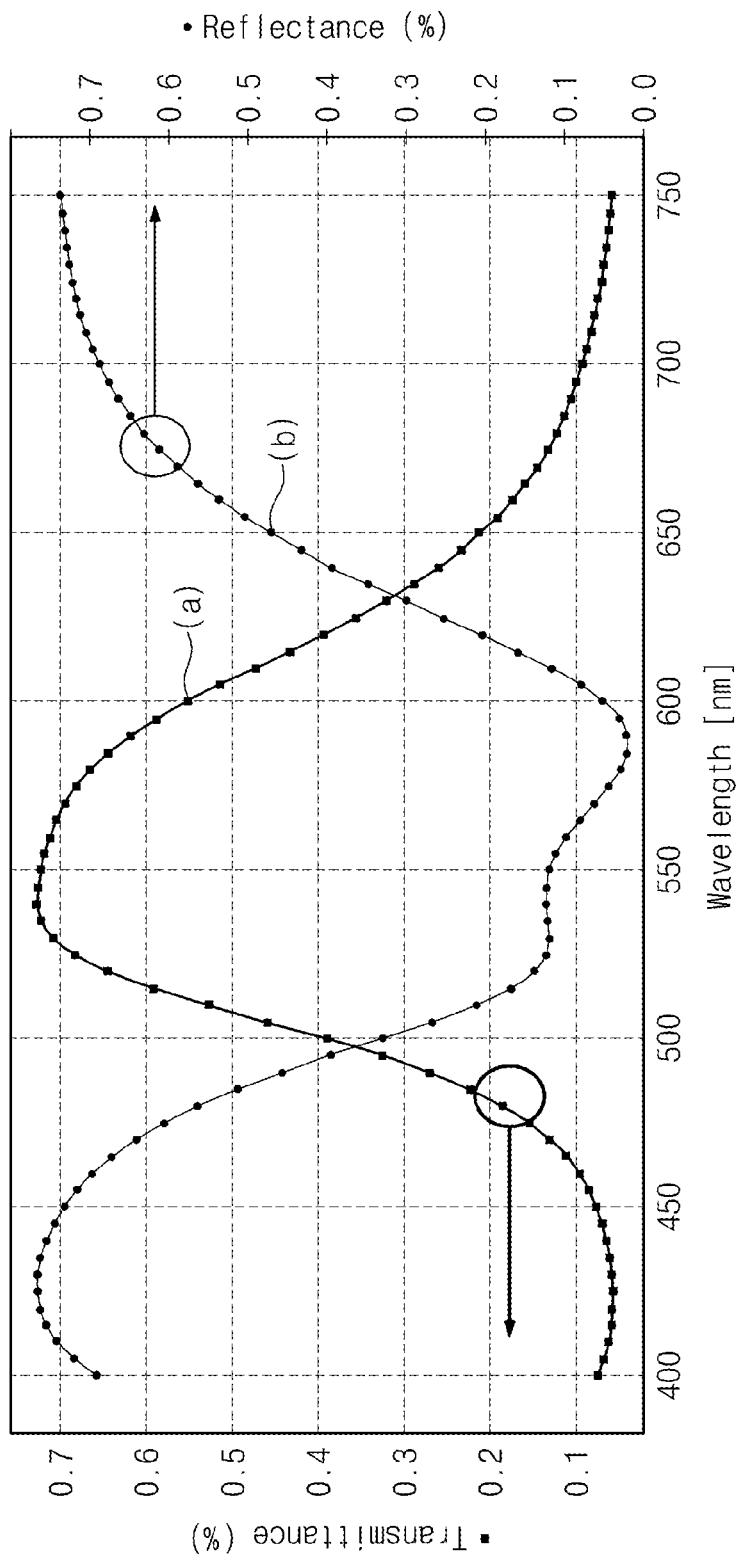
FIG. 2 is a graph illustrating a transmittance and a reflectance for each wavelength of the capping layer according to an embodiment of the present invention.

FIG. 2 is a graph illustrating a transmittance and a reflectance for each wavelength of the capping layer according to an embodiment of the present invention. Hereinafter, the graph of FIG. 2 will be described with reference to FIG. 1.

Referring to FIG. 2, the capping layer 300 may have a transmittance (a) and a reflectance (b) according to a wavelength of light. For example, it may be seen that the capping layer 300 has the high transmittance (a) with respect to light having a wavelength of about 500 nm to about 650 nm. Also, it may be seen that the capping layer 300 has the high reflectance (b) with respect to light having a wavelength of about 400 nm to a wavelength of about 500 nm and about 650 nm to about 750 nm. It may be seen that the transmittance (a) of the capping layer 300 is inversely proportional to the reflectance (b) of capping layer 300.

The capping layer 300 may reflect the light having a first wavelength $\lambda 1$. The light generated from the first light emitting part 200 may be emitted toward the first electrode 210 and/or the second electrode 230. The light emitted toward the first electrode 210 may be emitted to the outside of the hybrid light emitting device 1 through the substrate 100. The light emitted toward the second electrode 230 may be reflected toward the substrate 100 by the capping layer 300. Thus, the light having the first wavelength $\lambda 1$ emitted from the first light emitting part 200 may be emitted in one direction (i.e., toward the substrate 100) by the capping layer 300. As the capping layer 300 is provided, the first light emitting part 200 may be increased in light efficiency. The light emitted from the second light emitting part 400 may pass through the capping layer 300. Since the hybrid light emitting device 1 includes the capping layer 300 and/or the second light emitting part 400, the light having the first wavelength $\lambda 1$ may be combined with the light having the second wavelength $\lambda 2$. The hybrid light emitting device 1 may have improved luminance and easily realize a desired color. The color realized by hybrid light emitting device 1 may be adjusted by controlling transmittance selectivity of the capping layer 300 with respect to the wavelength. The transmittance and reflectance selectivity of the capping layer 300 with respect to a specific wavelength may be adjusted by controlling a thickness of the capping layer 300. For example, the capping layer 300 may have a reflectance of about 40% or more with respect to the first wavelength λ1 and a transmittance of about 60% or more with respect to the second wavelength λ2.

The second light emitting part 400 includes an emitting device (an organic or inorganic light emitting device). For example, the second light emitting part 400 may include an optical layer 410 and an inorganic light emitting device (LED) 420 which are sequentially stacked on the capping layer 300.

The optical layer 410 may convert a point light source generated from inorganic light emitting device 420 into a surface light source and may transmit the light emitted from the second light emitting part 400 into the capping layer 300 and/or the first light emitting part 200.

The inorganic light emitting device 420 may generate light having the second wavelength λ2 different from that of the organic light emitting layer 220 containing an organic light emitting material due to a difference in light emitting materials. The hybrid light emitting device 1 may realize more various colors by combining the first light emitting part 200 including the organic light emitting layer 220 with the second light emitting part 400 including the inorganic light emitting device 420.

The color realized by the hybrid light emitting device 1 may be adjusted also by controlling power supplied into the first light emitting part 200 and the second light emitting part 400. For example, the first light emitting part 200 emits light having a red color, and the second light emitting part 400 may emit light having a green color. A color realized in the light emitting device 1 may be a color in which a red color and a green color are mixed with each other. Here, the red color may be adjusted in intensity by controlling power applied into the first light emitting part 200. Also, the green color may be adjusted in intensity by controlling a power applied into the second light emitting part 400. Thus, the hybrid light emitting device 1 may easily realize desired colors.

Figure 3:
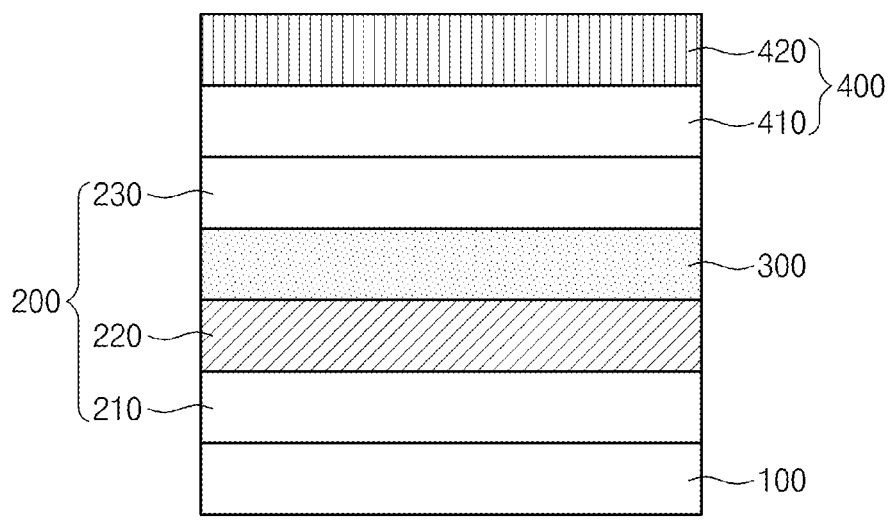
FIG. 3 is a cross-sectional view illustrating a hybrid light emitting device according to another embodiment of the present invention.

FIG. 3 is a cross-sectional view illustrating a hybrid light emitting device according to another embodiment of the present invention. Hereinafter, for conciseness of description, duplicated descriptions will be omitted.

Referring to FIG. 3, a hybrid light emitting device 2 includes a first emitting part 200, a capping layer 300, and a second emitting part 400 which are disposed on a substrate 100. The first emitting part 200 includes an organic light emitting device (OLED). For example, the first emitting part 200 includes a first electrode 210, an organic emitting layer 220, and a second electrode 230 which are sequentially stacked on the substrate 100. The first emitting part 200 may generate light having a first wavelength λ1. The second light emitting part 400 may include a light emitting device. For example, the second light emitting part 400 may include an optical layer 410 and an inorganic light emitting device (LED) 420 which are sequentially stacked on the second electrode 230. The second light emitting part 400 may generate light having a second wavelength λ2. The capping layer 300 may be disposed between the organic light emitting layer 220 and the second electrode 230 of the first light emitting part 200. The capping layer 300 may reflect the light having the first wavelength and transmit the light having the second wavelength. The hybrid light emitting device 2 may have improved luminance by coupling the first light emitting part 200 to the second light emitting part 400 and providing the capping layer 300. Also, the hybrid light emitting device 2 may easily realize desired colors.

The hybrid light emitting device according to the embodiments of the present invention may include the first light emitting part, the capping layer, and the second light emitting part on the substrate. The hybrid light emitting device according to the present invention may be improved in luminance by coupling the first to the second light emitting part and providing the capping layer. The hybrid light emitting device may easily realize the desired colors.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A hybrid light emitting device comprising:
   a substrate;
   a first light emitting part on the substrate, the first light emitting part including a first electrode, an organic light emitting layer, and a second electrode which are sequentially stacked on the substrate;
   a second light emitting part spaced apart from the first light emitting part so as to face the first light emitting part; and
   a capping layer disposed between the first light emitting part and the second light emitting part, wherein
   the first electrode has a refractive index different from that of the substrate, and
   the second electrode has a refractive index different from that of the capping layer.

2. The hybrid light emitting device of claim 1, wherein
   the first light emitting part emits light having a first wavelength,
   the second light emitting part emits light having a second wavelength different from the first wavelength, and
   the capping layer reflects the light having the first wavelength and allows the light having the second wavelength to pass therethrough.

3. The hybrid light emitting device of claim 2, wherein the light having the first wavelength and the light having the second wavelength are mixed to form a color.

4. The hybrid light emitting device of claim 1, wherein the second light emitting part comprises an optical layer and an inorganic light emitting device which are sequentially stacked on the capping layer.

5. The hybrid light emitting device of claim 1, wherein
   the first light emitting part emits light having a first wavelength,
   the second light emitting part emits light having a second wavelength different from the first wavelength, and
   the first electrode has a thickness corresponding to
   about ¼ times or less than ¼ times the first wavelength, and
   about ¼ times or less than ¼ times the second wavelength.

6. A hybrid light emitting device comprising:
   a substrate
   a first electrode on the substrate;
   an organic light emitting layer on the first electrode;
   a capping layer on the organic light emitting layer;
   a second electrode on the capping layer; and a light emitting part on the second electrode,
wherein the capping layer both
reflects light emitted from the organic light emitting layer, and
allows light, emitted from the light emitting part, to pass through the capping layer.

7. The hybrid light emitting device of claim 6, wherein the light emitted from the organic light emitting layer has a wavelength different from that of the light emitted from the light emitting part.

8. The hybrid light emitting device of claim 6, wherein the light emitted from the organic light emitting layer and the light emitted from the light emitting part are mixed to realize a color.

9. The hybrid light emitting device of claim 6, wherein the organic light emitting layer, the capping layer, and the second electrode are disposed in that stated order on a straight line.

10. The hybrid light emitting device of claim 6, wherein the second electrode is electrically connected with the organic light emitting layer so that the organic light emitting layer generates the light emitted from the organic light emitting layer.

11. The hybrid light emitting device of claim 6, wherein the organic light emitting layer generates the light emitted therefrom through recombination of electrons and holes supplied from both of the first and second electrodes.

12. A hybrid light emitting device comprising:
a substrate;
a first electrode on the substrate;
an organic light emitting layer on the first electrode;
a capping layer on the organic light emitting layer;
a second electrode on the capping layer; and
a light emitting part on the second electrode, the light emitting part including
an optical layer on the second electrode; and
an inorganic light emitting device on the optical layer.

13. The hybrid light emitting device of claim 12, wherein the optical layer converts a point light source generated from the inorganic light emitting device into a surface light source.

14. The hybrid light emitting device of claim 12, wherein the second electrode is electrically connected with the organic light emitting layer so that the organic light emitting layer generates light.

15. The hybrid light emitting device of claim 12, wherein the organic light emitting layer generates light through recombination of electrons and holes supplied from both of the first and second electrodes.

* * * * *